United States Patent [19]

Ramsden

[11] Patent Number: 4,982,155
[45] Date of Patent: Jan. 1, 1991

[54] HALL SENSOR WITH HIGH PASS HALL VOLTAGE FILTER

[75] Inventor: Edward A. Ramsden, Concord, N.H.

[73] Assignee: Sprague Electric Company, North Adams, Mass.

[21] Appl. No.: 372,809

[22] Filed: Jun. 29, 1989

[51] Int. Cl.[5] .................. G01R 33/06; H01L 43/06
[52] U.S. Cl. .................. 324/207.20; 324/251; 324/174; 333/172
[58] Field of Search ............ 324/207, 208, 251, 235, 324/247, 545; 333/172; 330/107, 109

[56] References Cited

U.S. PATENT DOCUMENTS

| | | | |
|---|---|---|---|
| 3,148,344 | 9/1964 | Kaufman | 333/172 |
| 3,174,111 | 3/1965 | Grover | 333/172 X |
| 3,195,043 | 7/1965 | Burig et al. | 324/251 X |
| 3,408,563 | 10/1968 | Chapman et al. | 324/251 |
| 3,604,947 | 9/1971 | Puthuff | 333/172 X |
| 3,818,380 | 6/1974 | Tyre | 333/172 |
| 4,013,946 | 3/1977 | Lewis | 324/247 |
| 4,123,712 | 10/1978 | Mikhael | 333/172 X |
| 4,218,659 | 8/1980 | Arai | 330/6 |
| 4,300,125 | 11/1981 | Loshing et al. | 324/142 X |
| 4,656,416 | 4/1987 | Brasfield | 324/133 X |
| 4,808,932 | 2/1989 | Schulz, Jr. et al. | 324/545 |
| 4,859,941 | 8/1989 | Higgs et al. | 324/251 X |

FOREIGN PATENT DOCUMENTS 55-143428 11/1980 Japan .
56-66527 6/1981 Japan .
58-137774 8/1983 Japan .
60-84987 5/1985 Japan .

OTHER PUBLICATIONS

IBM Technical Disclosure Bulletin, "Differential Second-Order Lowpass Filter", vol. 27, No. 11, Apr. 1985, pp. 6484-6485.

Primary Examiner—Gerard R. Strecker
Assistant Examiner—Warren S. Edmonds

[57] ABSTRACT

A Hall sensor has at least one Hall element connected to the input of a differential high pass filter which includes a series branch circuit made up of two outer resistors and a central capacitor connected between the two resistors, a first summing circuit with inputs connected across the capacitor plus one of the branch resistors, a second summing circuit connected across the capacitor plus the other of the branch resistors, and a subtraction circuit having the input connected to the outputs of said first and second summing circuits. The subtraction circuit may be a differential amplifier or a differential comparator such as a differential Schmitt trigger circuit. This sensor is particularly advantageous in an electrically noisy environment, for example in use as a combustion-engine-vehicle gear tooth counting sensor, where the high common mode rejection feature of this Hall sensor reduces the chances for false counting.

7 Claims, 2 Drawing Sheets

HALL ELEMENTS    DIFFERENTIAL HIGH PASS FILTER 19

HALL SENSOR WITH HIGH PASS HALL VOLTAGE FILTER

BACKGROUND OF THE INVENTION

This invention relates to a magnetic field sensor including at least one Hall element that is connected to the input of a differential single pole high pass filter which may be further connected to the input of a comparator or Schmitt trigger circuit for counting the passage of ferromagnetic articles.

There is disclosed in the U.S. Pat. No. 4,218,659, issued Aug. 19, 1980, several AC coupled Hall voltage amplifiers connected to the output of a Hall element for use in a magnetic pick-up or play back head intended for detecting signals on a passing magnetic tape or the like. These amplifiers employ five or six capacitors and provide high pass filtering with numerous poles. These circuits are aimed at reducing the thermal noise of the Hall element, circuit resistors and transistors of the sensor head itself that tends to be combined with the sensing head output signal.

It is an object of the present invention to provide a ferromagnetic article sensor having a Hall element and a Hall signal high pass filter with only one filter capacitor so that the output signal is substantially free of electrical impulses and other noise that may be present on the DC power lines as well as the DC voltage component of the Hall output voltage.

SUMMARY OF THE INVENTION

A Hall sensor includes one or more Hall elements with outputs connected to the input of a differential high pass filter. The high pass filter has a series circuit branch made up of a resistor, a capacitor and another resistor in that order. The outer resistor ends of the series circuit branch serve as the two filter input conductors. A first summing circuit, or adder, has one input connected to one of the filter input conductors and another input connected to the termination of the capacitor which is connected through one of the branch resistors to the other of the filter input conductors. In a symmetrical fashion, a second summing circuit has one input connected to the other of the filter input conductors and has another input connected to the other termination of the capacitor. A signal subtraction circuit means has two inputs connected respectively to the outputs of the first and second summing circuit for providing an output signal that is a function of the difference between the signals appearing at the outputs of the first and second summing circuits.

DESCRIPTION OF THE PREFERRED EMBODIMENTS

Figure 1:
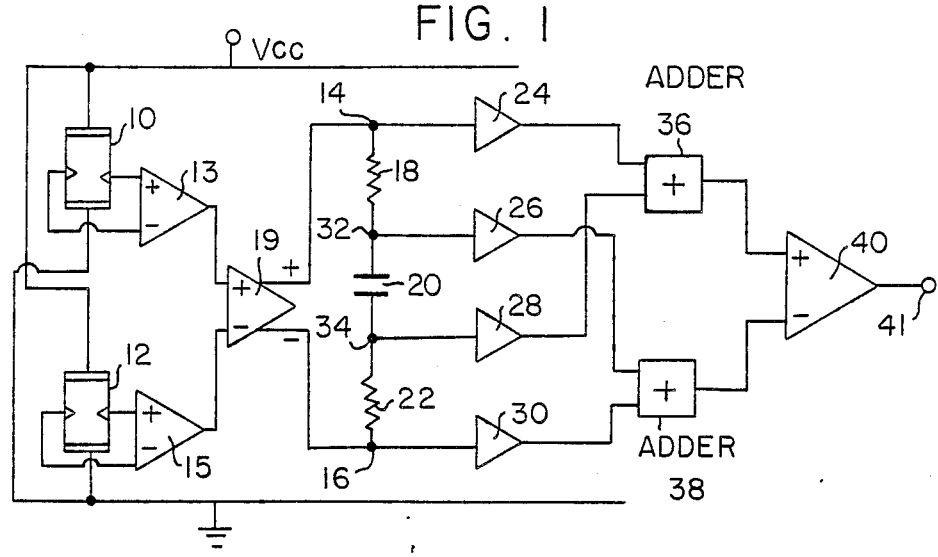
FIG. 1 shows a block diagram of a Dual-Hall sensor of this invention.

The two Hall devices 10 and 12 of FIG. 1 have outputs connected differentially so that when these two Hall devices 10 and 12 are mounted in a plane through which there exists a normal component of a magnetic field, then at their differential output, i.e. the circuit points 14 and 16, the differential Hall output voltage is proportional to the magnetic field gradient between the Hall devices 10 and 12. This differential connection is accomplished by the differential amplifiers 13, 15 and 17. A Hall sensor that includes two such differentially connected Hall elements is disclosed in the patent application to Higgs et al, Ser. No. 027,363 filed Feb. 23, 1989 and assigned to the same assignee as is the present invention. Those differentially connected Hall outputs are connected to the input, conductors 14 and 16, of a differential high pass filter 19.

Connected across the differential filter input is a series circuit branch including a branch resistor 18, a capacitor 20 and a branch resistor 22. Four unity-gain buffer amplifiers 24, 26, 28 and 30 have their inputs connected respectively to the circuit points 14, 32, 34 and 16.

Two inputs of a signal-adder circuit 36 are connected respectively to the series circuit branch at points 14 and 34 via buffer amplifiers 24 and 28. In a symmetrical fashion, the signal-adder circuit 38 has two inputs respectively connected to the series circuit branch at the other two junction points 32 and 16 via buffer amplifiers 26 and 30.

A differential amplifier 40 has two inputs respectively connected to the outputs of the adders 36 and 38. Amplifier 40 serves as a subtraction circuit with respect to the two outputs of the adder circuits 36 and 38.

When only a constant or DC voltage appears between the circuit points 14 and 16, no current will flow in the resistors 18 and 22 and there is no voltage difference at the inputs of adder 36 or adder 38. Thus there will be no output voltage at the output 41 of amplifier 40. But changes in the magnetic field gradient and therefore the differential Hall's output voltage at points 14 and 16 will result in a corresponding change in output voltage at terminal 41.

Figure 2:
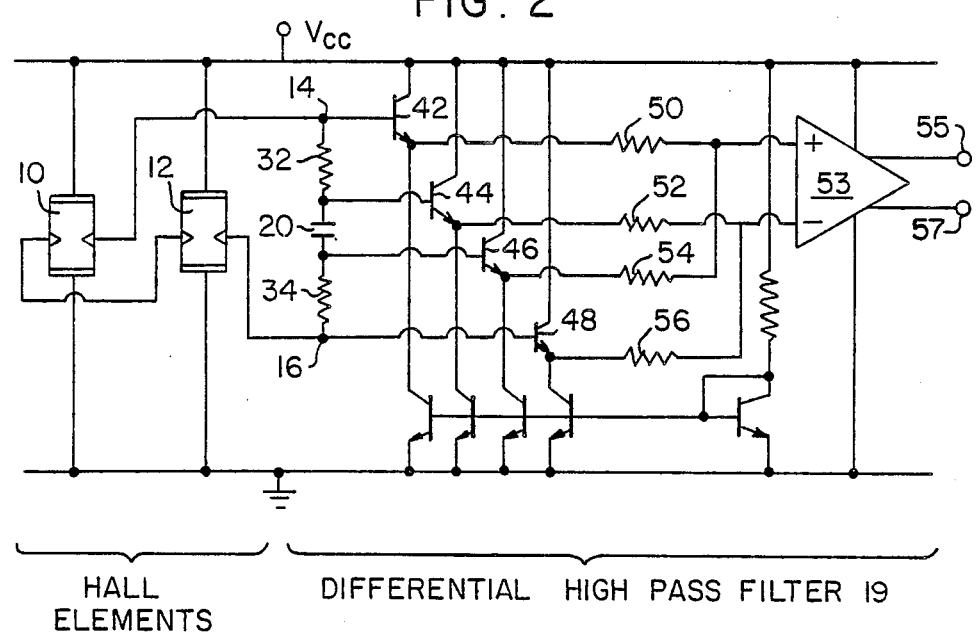
FIG. 2 shows a circuit diagram of the Dual-Hall sensor of FIG. 1.

In the circuit of FIG. 2, the unity-gain buffer amplifiers 24, 26, 28 and 30 are each an emitter follower circuit employing respectively transistors 42, 44, 46 and 48. The adder circuit 36 is composed of two summing resistors 50 and 54, while the adder circuit 38 is composed of summing resistors 52 and 56. Thus the differential output of the two Hall elements 10 and 12 is connected at circuit points 14 and 16 that serve as the differential input of the following filter circuitry which is a differential first-order high pass filter, employing a single capacitor and exhibiting good common mode rejection. The amplifier 53 has differential inputs and outputs 55 and 57 advantageously maintaining the differential structure and common mode rejection throughout.

Figure 3:
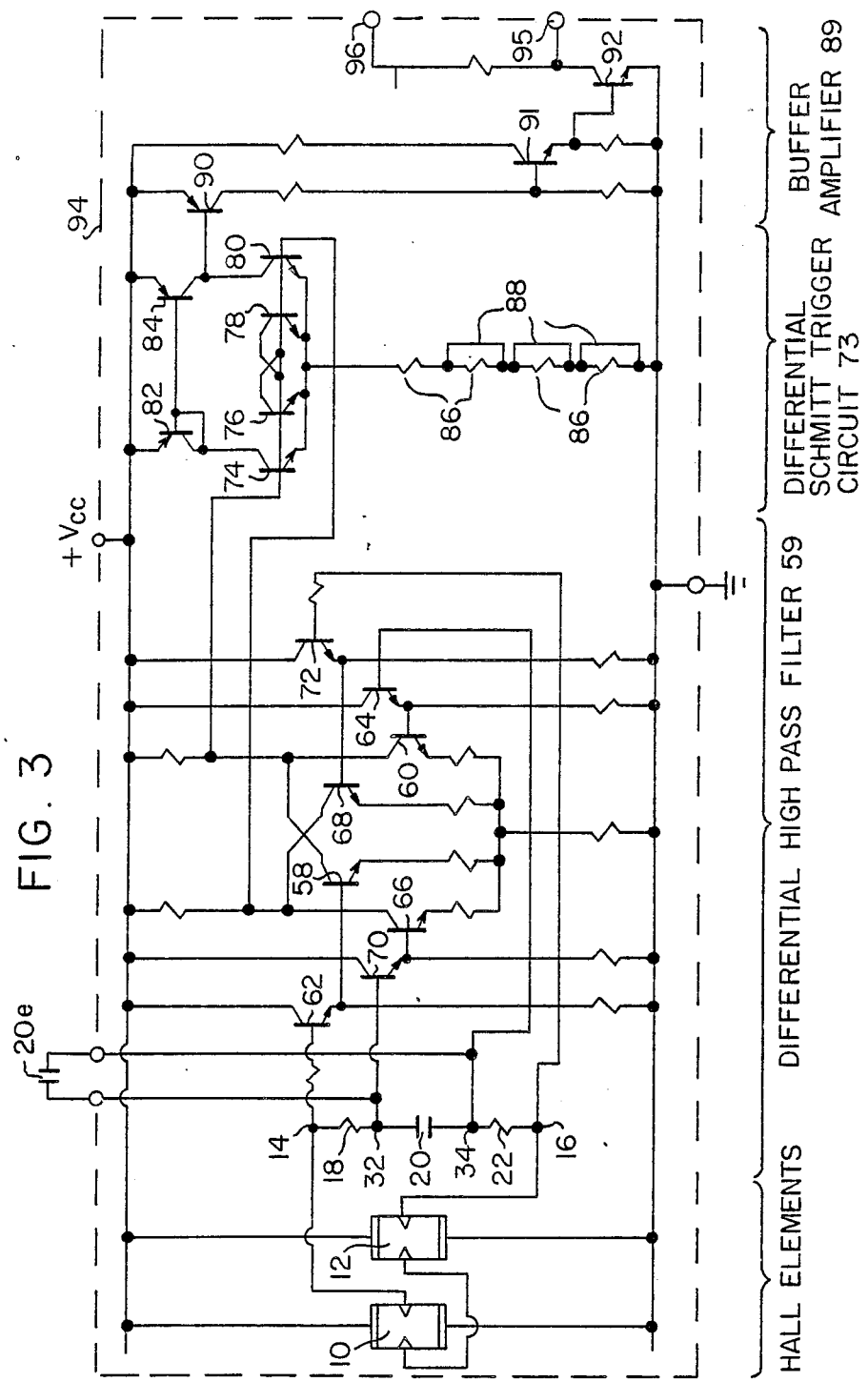
FIG. 3 shows a circuit diagram of a Dual-Hall proximity detector incorporating a Hall sensor of this invention.

Turning now to FIG. 3, the differentially connected Hall elements 10 and 12 and the series circuit branch across the input of the differential high pass filter 59 are borrowed without change from the embodiment of FIG. 2.

An adder circuit comprised of parallel connected transistors 58 and 60 have their bases connected respectively to circuit points 14 and 34 via emitter follower buffers respectively including transistors 62 and 64. The other adder circuit is comprised of the parallel connected transistors 66 and 68 whose bases are connected respectively to circuit points 32 and 16 via emitter follower buffers respectively employing transistors 70 and 72.

The output of the first mentioned adder circuit, taken at the collectors of summing transistors 58 and 60, and the output of the second mentioned adder circuit, taken at the collectors of summing transistors are connected to the differential input of a differential Schmitt trigger circuit 73 comprised of transistors 74, 76, 78, 80, 82 and 84. Some in the string of Schmitt trigger circuit emitter resistors 86 are shunted by conductive links 88 that may be removed as needed to adjust the operate point to a desired or target voltage value.

Thus the differential Schmitt trigger circuit serves the signal subtraction function here that is a primary purpose of differential amplifier 40 in the sensor of FIGS. 1 and 2.

The buffer amplifier 89 comprised of transistors 90, 91 and 92 has an input connected to the output of the Schmitt trigger circuit. The entire Hall sensor is built in one silicon integrated circuit chip 94.

A binary output voltage may be taken at output pad 95 when pad 96 is connected to $V_{cc}$. Otherwise a binary output current may be taken at output terminal 96.

The single capacitor 20 of the high pass filter is shown entirely integrated in the semiconductor chip. However, if lower pass frequencies are desired an external capacitor 20e may be substituted or used in parallel with integrated capacitor 20. Any known integrated capacitor structures may be suitable for realizing capacitor 20; even the inherent inter wiring and/or PN-junction capacitance may suffice. Otherwise, a standard MOS capacitor, a reverse biased PN diode or a conventional metal-insulator-metal structure carried on the surface of the silicon chip are anticipated.

The differential circuit of FIGS. 2 and 3 by which the outputs of the two Hall elements 10 and 12 are differentially connected to the filter input, is simple but the more elaborate differential circuit shown in FIG. 1 is preferred when greater Hall gain and even better common mode rejection are overriding considerations.

What is claimed is:

1. A Hall sensor comprising one Hall element and a differential high pass filter having a differential input connected to the output of said Hall element, said filter comprising:
    a series circuit branch consisting of a first resistor, a capacitor and a second resistor connected in that order, said series branch being connected across the differential-filter input conductors;
    a first summing circuit having one input connected to one of said filter input conductors and having another input connected to the end of said capacitor which end is connected through one of said branch resistors to the other of said filter input conductors;
    a second summing circuit having one input connected to said other of said filter input conductors and having another input connected to the other end of said capacitor; and
    a signal subtraction circuit means having one and another inputs connected respectively to the output of said first summing circuit and to the output of said second summing circuit, for providing an output signal that is a function of the difference between the signals appearing at the outputs of said first and second summing circuits.

2. The Hall sensor of claim 1 entirely embodied in a silicon integrated circuit.

3. The Hall sensor of claim 1 additionally comprising another Hall element having an output through which said output of said one Hall element is connected to said differential input of said high pass filter.

4. The Hall sensor of claim 3 wherein said one and another Hall elements lie in a common plane and said outputs of said one and another Hall elements are differentially connected to said filter input.

5. The Hall sensor of claim 1 wherein each of said summing circuits is comprised of a pair of series-connected summing resistors, said inputs of which are respectively the two free ends of each of said pairs of series connected resistors and said outputs of which are respectively the connections between said each of said pairs of said series connected resistors.

6. The Hall sensor of claim 1 wherein said first summing circuit is comprised of first and second bipolar transistors with commonly connected emitters and commonly connected collectors that serve as said first summing circuit output, said first summing circuit inputs being the bases respectively of said first and second transistors.

7. The Hall sensor of claim 6 wherein said second summing circuit is comprised of third and fourth bipolar transistors with commonly connected emitters and commonly connected collectors which serve as said second summing circuit output and said second summing circuit inputs being the bases respectively of said third and fourth transistors.

* * * * *